(12) United States Patent
Senegas et al.

(10) Patent No.: US 8,848,992 B2
(45) Date of Patent: Sep. 30, 2014

(54) SUSCEPTIBILITY GRADIENT MAPPING

(75) Inventors: Julien Senegas, Hamburg (DE); Thomas Perkins, Fort Collins, CO (US)

(73) Assignee: Koninklijke Philips N.V., Eindhoven (NL)

( * ) Notice: Subject to any disclaimer, the term of this patent is extended or adjusted under 35 U.S.C. 154(b) by 87 days.

(21) Appl. No.: 13/520,799

(22) PCT Filed: Jan. 19, 2011

(86) PCT No.: PCT/IB2011/050230
§ 371 (c)(1),
(2), (4) Date: Jul. 6, 2012

(87) PCT Pub. No.: WO2011/089551
PCT Pub. Date: Jul. 28, 2011

(65) Prior Publication Data
US 2013/0034285 A1    Feb. 7, 2013

Related U.S. Application Data

(60) Provisional application No. 61/297,299, filed on Jan. 22, 2010.

(51) Int. Cl.
*G06K 9/00* (2006.01)
*G01R 33/561* (2006.01)
*G01R 33/565* (2006.01)
*G01R 33/28* (2006.01)
*G01R 33/56* (2006.01)

(52) U.S. Cl.
CPC ........ *G01R 33/56536* (2013.01); *G01R 33/286* (2013.01); *G01R 33/5615* (2013.01); *G01R 33/5601* (2013.01)
USPC ............... 382/128; 378/4; 324/331; 430/39

(58) Field of Classification Search
USPC ............... 382/100, 128, 129, 130, 131, 132; 128/922; 378/4–27; 324/313, 319, 331; 430/39

See application file for complete search history.

(56) References Cited

U.S. PATENT DOCUMENTS 6,479,999 B1 * 11/2002 DeMeester et al. ........... 324/318
6,501,272 B1    12/2002 Haacke et al.
(Continued)

FOREIGN PATENT DOCUMENTS

WO    2006117704 A1    11/2006
WO    2007122527 A2    11/2007

OTHER PUBLICATIONS

Chen, N-K, et al.; Application of k-space energy spectrum analysis to susceptibility field mapping and distortion correction in gradient-echo EPI; 2006; Neuroimage; 31(2)609-622.

(Continued)

*Primary Examiner* — Anand Bhatnagar

(57) ABSTRACT

The invention relates to a method of determining a susceptibility gradient map, the method comprising acquiring (300) a magnetic resonance k-space dataset, said dataset comprising magnetic resonance echo data, wherein a recursive iteration is used to determine the susceptibility gradient map. Further, the invention relates to a method of determining a susceptibility gradient map, the method comprising acquiring a magnetic resonance k-space dataset, said dataset comprising magnetic resonance echo data, wherein the acquired dataset comprises magnetic resonance echo data of multiple echoes with different echo times, wherein a susceptibility gradient map is determined separately for each echo time resulting in a temporary susceptibility gradient map, wherein the method further comprises calculating a total susceptibility gradient map by combining all determined temporary susceptibility gradient maps.

14 Claims, 4 Drawing Sheets

(56) References Cited

U.S. PATENT DOCUMENTS

| | | | |
|---|---|---|---|
| 6,658,280 B1 | 12/2003 | Haacke | |
| 6,771,998 B2* | 8/2004 | Kirsch | 600/410 |
| 7,847,546 B2* | 12/2010 | Takizawa et al. | 324/307 |
| 8,126,237 B2* | 2/2012 | Kimura | 382/131 |
| 8,422,756 B2* | 4/2013 | Haacke et al. | 382/131 |
| 2007/0282200 A1 | 12/2007 | Johnson et al. | |
| 2009/0080750 A1* | 3/2009 | Krueger et al. | 382/131 |
| 2009/0175523 A1* | 7/2009 | Chen et al. | 382/130 |
| 2010/0142785 A1* | 6/2010 | Dahnke et al. | 382/131 |

OTHER PUBLICATIONS

Dahnke, H., et al.; Susceptibility Gradient Mapping (SGM): A New Postprocessing Method for Positive Contrast Generation Applied to Superparamagnetic Iron Oxide Particle (SPIO)-Labeled Cells; 2008; MRM; 60(3)595-603.

Dahnke, H., et al.; Optimal Positive Contrast of Labeled Cells via Conventional 3D Imaging; 2006; Proc. Intl. Soc. Mag. Reson. Med.; 14:361.

Dahnke, H., et al.; High Resolution Positive Contrast via Post-Processing from Conventional 3D Imaging; 2008; Proc. Intl. Soc. Mag. Reson. Med.; 16:1513.

Haacke, E. M., et al.; Susceptibility-Weighted Imaging: Technical Aspects and Clinical Applications, Part 1; 2009; AJNR; 30:19-30.

Liu, G.; Reconstruction of MRI signal losses in EPI images; 2005; IEEE Trans. on Engineering in Medicine and Biology Conference; pp. 1332-1335.

Rahmer, J., et al.; Three-dimensional radial ultrashort echo-time imaging with T2 adapted sampling; 2006; MRM; 55(5)abstract.

Reichenbach, J. R., et al.; Theory and application of static field inhomogeneity effects in gradient-echo imaging; 1997; Journal of Magnetic Resonance Imaging; 7(2)abstract.

\* cited by examiner

US 8,848,992 B2

SUSCEPTIBILITY GRADIENT MAPPING

CROSS REFERENCE TO RELATED APPLICATIONS

This application claims the benefit of U.S. provisional application Ser. No. 61/297,299 filed Jan. 22, 2010, which is incorporated herein by reference.

FIELD OF THE INVENTION

The present invention relates to a method of determining a susceptibility gradient map, a computer program product and a device for determining a susceptibility gradient map of an object by magnetic resonance imaging.

Image forming MR (magnetic resonance) methods which utilize the interaction between magnetic fields and nuclear spins in order to form 2-dimensional or 3-dimensional images are widely used nowadays, notably in the field of medical diagnostics, because for the imaging of soft tissue they are superior to other imaging methods in many respects, do not require ionizing radiation and are usually not invasive.

BACKGROUND OF THE INVENTION

According to the MR method in general, the body of a patient or in general an object has to be arranged in a strong, uniform magnetic field whose direction at the same time defines an axis (normally the z-axis) of the coordinate system on which the measurement is based. The magnetic field produces different energy levels for the individual nuclear spins independent of the magnetic field strength which nuclear spins can be excited (spin resonance) by application of an electromagnetic alternating field (RF field) of defined frequency (so called Larmor frequency, or MR frequency). From a microscopic point of view, the distribution of the individual nuclear spins produces an overall magnetization which can be deflected out of the state of equilibrium by application of an electromagnetic pulse of appropriate frequency (RF pulse) while the magnetic field extends perpendicular to the z-axis, also referred to as longitudinal axis, so that the magnetization performs a precessional motion about the z-axis. The precessional motion describes the surface of a cone whose angle of aperture is referred to as flip angle. The magnitude of the flip angle is dependent on the strength and the duration of the applied electromagnetic pulse. In the case of the so called 90 degree pulse, the spins are deflected from the z-axis to the transverse plane (flip angle 90 degrees).

After termination of the RF pulse, the magnetization relaxes back to the original state of equilibrium, in which the magnetization in the z-direction is built up again with a first time constant T1 (spin-lattice or longitudinal relaxation time), and the magnetization in the direction perpendicular to the z-direction relaxes with a second time constant T2 (spin or transverse relaxation time). The variation of the magnetization can be detected by means of receiving RF coils which are arranged and oriented within an examination volume of the MR device in such a manner that the variation of the magnetization is measured in the direction perpendicular to the z-axis. The decay of the transverse magnetization is accompanied, after application of, for example a 90 degree pulse, by a transition of the nuclear spins induced by local magnetic field inhomogeneities from an ordered state with the same phase to a state in which all phase angles are uniformly distributed (de-phasing). The de-phasing can be compensated by means of a refocusing pulse, for example 180 degree pulse. This produces an echo signal (spin echo) in the receiving coils.

In order to realise spatial resolution in the body, linear magnetic field gradients extending along the three main axes are superimposed on the uniform magnetic field, leading to a linear spatial dependency of the spin resonance frequency. The signal picked up in the receiving coils then contains components of different frequencies which can be associated with different locations in the body. The signal data obtained via the receiving coils correspond to the spatial frequency domain and are called k-space data. The k-space data usually include multiple lines acquired with different phase encoding. Each line is digitized by collecting a number of samples. A set of k-space data is converted to an MR image by means of Fourier transformation.

SUMMARY OF THE INVENTION

An object having a magnetic susceptibility that deviates from the surrounding creates local inhomogeneities of the main magnetic field. This applies to metallic objects such as surgical instruments, implants or other devices, iron-containing substances like deoxygenated blood and naturally occurring iron deposits within tissue, or iron oxide-based contrast agents or labelled cells. This also applies to empty regions within the imaged body since there is a strong susceptibility difference between the empty region (filled with gas) and the surrounding tissue. The exploitation of this effect is an important tool for different MR imaging applications ranging from detection of contrast agent (e.g. SPIO) and of naturally occurring tissue boundaries to the localization of devices like catheters or implants.

Susceptibility contrast enhanced MR imaging is usually performed via $T_2$ or $T_2$* weighted sequences. With these sequences the contrast is created by signal losses at the side of a local magnetic field disturbance. In the images generated by these known techniques, dark image features that are due to field inhomogeneities cannot be distinguished from features that are due to other effects leading to signal losses, like low spin density or very short T2 time.

Several MR sequences have been proposed to convert this dark signal into a positive contrast. The different approaches show bright positive contrast images, but prior knowledge about the strength of the field disturbance is required in order to optimize positive image contrast. This is avoided by means of several post-processing methods that have been developed to calculate the positive contrast from a gradient echo image. During the acquisition of the gradient echo-based images, susceptibility gradients locally alter the imaging gradients that are applied. Additionally to the well-known geometric distortion, this leads to a shift of the affected echo in k-space. Determination of this shift for every imaging voxel (3D pixel) leads to a map of the susceptibility induced gradients.

In order to determine a susceptibility gradient map, currently two algorithms are used. The first algorithm is the 'original susceptibility gradient mapping' (SGM) algorithm which relies on the computation of small term Fourier transforms. This method is in detail discussed for example in WO 2007/122527 A2. A second method that yields susceptibility gradient maps at higher resolution relies on the use of truncated Fourier transforms. This algorithm, in the following denoted as 'true resolution SGM', is described in detail in Dahnke H, Liu W, Bowtell. R, Frank J A, High Resolution Positive Contrast via Post-Processing from Conventional 3D Imaging, Int Soc Magn Reson Med 2008; 16 1513. It is based on a k-space energy spectrum analysis method introduced in Chen N, Oshio K, Panych L P, Application of k-space energy spectrum analysis to susceptibility field mapping and distortion correction in gradient-echo EPI, NeuroImage 2006; 31:609-622.

Algorithms for true resolution SGM are associated with very high computation times which prevent them to be applied for a clinical routine. The computation time for a 2D map for a 64×64×1 image with the algorithm proposed in the above cited work by Chen et al is typically around 11 seconds, which implies that, for example, for a typical brain clinical dataset (256×256×150) computation time would be in the order of 40 hours. Improvements of the true resolution SGM as proposed in the above cited work by Dahnke et al may reduce the computation time in the order of 20 hours, which however is still too long for clinical application.

Therefore, it is readily appreciated that there is a need for an improved method for determining a true resolution susceptibility gradient map at high quality and high speed. It is consequently also an object of the invention to provide an MR device that enables the determination of a true resolution susceptibility gradient map at high quality and high speed.

In accordance with the invention, a method of determining a susceptibility gradient map is disclosed. The method comprises acquiring a magnetic resonance k-space dataset, said dataset comprising magnetic resonance echo data, and transforming the acquired k-space dataset into an image dataset I(x,y,z), wherein for a given k-space direction, for example x, the method comprises the following steps:

a) performing a 1D discrete Fourier transform of the image dataset along the given k-space direction, said 1D Fourier transform resulting in a set of Fourier terms, each Fourier term of said set being associated to a k-space index along the given k-space direction (x), b) selecting a truncation value (kx) steadily varying between $-N/2$ and $N/2$ along said k-space direction, where N is the size of the k-space dataset along that direction, c) generating recursively an updated image dataset $I_{ks}^{1}(x,y,z)$ by determining the Fourier term of the set of Fourier terms which associated k-space index number corresponds to said truncation value and subtracting the determined Fourier term from an image dataset $I_{kx-1}^{1}(x,y,z)$ generated in an immediate previous image dataset generation step, said subtraction resulting in a new updated image dataset $I_{kx}^{1}(x,y,z)$, d) calculating a magnitude $M_{kx}^{1}(x, y, z)$ of the new updated image dataset, e) repeating steps b) to d) with increasing or decreasing truncation value (kx), f) calculating for the given k-space direction an echo shift (m) from the magnitude variations between the new updated image datasets, g) calculating a susceptibility gradient ($G_{su}$) along the given k-space direction from said echo shift.

Preferably, the above mentioned steps are carried out for all k-space directions, wherein thereafter the different susceptibility gradient maps may be combined into one magnitude gradient map.

The method according to the invention permits to cut down dramatically the computation time as compared to known from state of the art true resolution SGM methods for determining a susceptibility gradient map without quality compromise, allowing the application of this technique in clinical practice. For example, in case clinical datasets described above are used as respective k-space datasets, computation times in the order of 10 minutes can be obtained.

Thus, according to the present invention, the application of repeated full-size, 3D Fourier transforms, as known from state of the art true resolution SGM techniques, is replaced by a sequential algorithm, in which a recursive relation is used to update the computation of the truncated Fourier transforms at each iteration. The resulting algorithm computes a 3D SGM in approximately $N_x \times N_y \times N_z \times (N_x+N_y+N_z)$ operations, thus allowing for processing large 3D datasets, as encountered in for example neurological applications, in a reasonable time.

In general, the input of the SGM technique is preferably a 3D, possibly also 2D complex image obtained with an echo sequence, for example a gradient-echo sequence. Gradient-echo sequences are known to be sensitive to B0 inhomogeneity in general and in particular to local changes in the magnetic susceptibility. Several effects or artefacts due to susceptibility induced B0 inhomogeneity are known, such as geometric distortion, abrupt signal decay, and echo shifts. In the SGM technique, the local echo shifts resulting from B0 inhomogeneity gradients are exploited to derive a map of these gradients.

The local echo shift m caused by a susceptibility induced B0 inhomogeneity gradient $G_{su}$ is given by the following equation:

$$m_{[x,y,z]} = -\frac{G_{su,[x,y,z]} \cdot TE}{(G_{[r,e,s]} + G_{su,[x,y,z]}) \cdot \tau_{[x,y,z]}} \quad (1)$$

where G is the imaging gradient applied in one of the three spatial directions (r: readout, e: phase encoding, s: slice), τ is the time interval during which the gradient G is applied (dwell time for the readout direction), and TE is the desired echo time of the sequence.

From this equation it is clear that the echo shift increases linearly with the echo time TE, for a given gradient $G_{su}$.

The relation in the above shown equation can be inverted to yield a simplified formula that relates echo-shift in k-space and strength of the susceptibility gradient $G_{su}$:

$$G_{su,[x,y,z]} \approx -G_{[r,e,s]} \frac{m_{[x,y,z]} \cdot \tau_{[x,y,z]}}{TE} \quad (2)$$

where $G_{su}$ is the susceptibility induced B0 inhomogeneity gradient, G is the imaging gradient (or gradient increment) applied in one of the three spatial directions (r: readout, e: phase encoding, s: slice), m is the echo shift, τ is the time interval during which the gradient G is applied (dwell time for the readout direction), and TE is the desired echo time of the sequence.

The true resolution SGM method proceeds by computing locally (i.e. for each voxel) the amount of echo shift in each spatial direction. This step is achieved by means of a k-space spectrum analysis. The principle of this analysis is illustrated thereafter in the case of the computation of the echo shift in the X-direction. Denoting S(kx,ky,kz) the acquired k-space signal and Nx the dimension of the sampling matrix in the X-direction, the true resolution SGM algorithm performs the following steps:

For each value of kx=−Nx/2 ... 0, set all samples S(k,ky,kz), k<kx, to 0. This truncated quantity is hereafter denoted $S_{kx}^{1}$. Compute then the magnitude of the 3D Fourier transform of $S_{ky}^{1}$, denoted $M_{kx}^{1}$.

Compute for each voxel the sum: $M_1(x,y,z) = \Sigma_{kx} M_{kx}^{1}(x,y,z)$. Repeat the same procedure for kx=+Nx/2 ... 0, which yields $M_2(x,y,z)$.

Compute the echo shift as the normalized difference: ($M_2(x, y, z) - M_1(x, y, z))/M(x, y, z)$, where M is the magnitude of the 3D Fourier transform of S (without any truncation).

The evolution of the quantity $M_{kx}$ as a function of the degree of truncation kx, is depicted in FIG. 1 in the absence of a B0 inhomogeneity gradient and in FIG. 2 in the presence of a B0 inhomogeneity gradient. A signal drop off 100 is observed for kx=0 in the first case, and a signal drop off 200 for kx≠0 in the second case. The difference $M_2(x,y,z) - M_1(x,y,z)$ is then proportional to the echo shift $m_x$ (see reference numeral 202 in FIG. 2) in the X-direction, which allows for the computation of the susceptibility gradient $G_{su,x}$ by means of the above shown equation (2).

As can be understood from the above description regarding state of the art true resolution SGM, repeated full-size 3D Fourier transformations of all truncated acquired k-space signals are performed in the true resolution SGM method, which consequently consumes a lot of time.

According to the present invention, truncation of the acquired k-space signal and subsequent 3D Fourier transformation are substituted by a sequential algorithm, in which a recursive relation is used. This can be understood with the following equations:

$$I_0^1(x, y, z) = I(x, y, z) \quad (3)$$

$$I_{kx}^1(x, y, z) = I_{kx-1}^1(x, y, z) - S(Nx/2 + kx, y, z)e^{i\frac{2\pi x(Nx/2+kx)}{Nx}}$$

$$M_{kx}^1(x, y, z) = \|I_{kx}^1(x, y, z)\|$$

Here, I(x,y,z) denotes the 3D complex image, $I_{kx}^1(x,y,z)$ the 3D Fourier transform of the truncated signal $S_{kx}^1(k, ky, kz)$, and S(k, y, z) the $k^{th}$ Fourier coefficient of the 1D Fourier transform (along the X-direction) of the image I(x,y,z), where k=0 corresponds to the "null" frequency term. It has to be noted that the 3D complex image I(x,y,z) may be obtained by a 3D Fourier transform of the signal S(kx,ky,kz).

The above shown equation provides a method to efficiently compute the terms $M_{kx}^1(x, y, z)$ involved in the computation of $M_1$. For the computation of $M_2$, the corresponding relation writes:

$$I_0(x, y, z) = I(x, y, z) \quad (4)$$

$$I_{kx}^2(x, y, z) = I_{kx-1}^2(x, y, z) - S(Nx/2 - kx, y, z)e^{i\frac{2\pi x(Nx/2-kx)}{Nx}}$$

$$M_{kx}^2(x, y, z) = \|I_{kx}^2(x, y, z)\|$$

It has to be noted that the method described above is performed preferably for all voxels (x, y, z). Preferably, the subtraction between $I_{kn}^1$ and the Fourier term is done voxel-wise. It further has to be noted, that a computation and storage of the exponents in Eqs. (3) and (4) is performed only once for each truncation value, e.g. by evaluating and storing explicitly the corresponding cosine and sine terms. These exponents may then be re-used when iterating over all voxels. These exponents depend only on the truncation value and, for example in case of the X-direction, on "x", not the other two indices "y" and "z".

This algorithm computes a 3D SGM in approximately $(Nx+Ny+Nz) \cdot Nx \cdot Ny \cdot Nz$ operations. For comparison, the original algorithm (use of repeated 3D Fourier transforms) requires $(Nx+Ny+Nz) \cdot (Nx \cdot Ny \cdot Nz) \cdot \ln(Nx \cdot Ny \cdot Nz)$ operations for the same computation, and the use of 1D Fourier transforms alone, without applying the recursive relations, requires $Nx \cdot Ny \cdot Nz(Nx \cdot \ln(Nx) + Ny \cdot \ln(Ny) + Ny \cdot \ln(Ny))$ operations.

In the above description, $M_1$ and $M_2$ are calculated and later on used in order to compute the echo shift by means of a normalized difference between $M_2$ and $M_1$. This corresponds to the embodiment of the invention, wherein in a first loop in step b the truncation value is steadily increasing from 0 to half of the size of the k-space dataset along said k-space direction, resulting in step c in first new updated image datasets and in step d in first magnitudes. Further, in this embodiment in a second loop in step b the truncation value is steadily decreasing from 0 to minus half of the size of the k-space dataset along said k-space direction, which results in step c in second new updated image datasets and in step d in second magnitudes. Further, in step f the echo shift is calculated from the difference between the sum of all second magnitudes of all second new updated image datasets and the sum of all first magnitudes of all first new updated image datasets.

However, it has to be noted that this is just an embodiment. Generally it is sufficient to compare in step f magnitude variations for different k-space truncation values and detect the k-space index at which an intensity change occurs for every voxel. By detecting the k-space index, at which the intensity change occurs, the shift in k-space for each voxel can be determined.

The feature of using a truncation value in between 0 and half of the size of the k-space dataset along a given k-space direction in combination with an echo shift calculation from the difference between the sum of all magnitudes of first and second updated image datasets (i.e. $M_2 - M_1$) is just to robustly determine the echo shift. Consequently, k-space truncation is performed for this purpose separately for both halves of k-space, from $+k_{max}$ to $k_0$ ($k_0=0$) and from the other direction $-k_{max}$ to $k_0$. However, any other technique of detecting the k-space index at which the intensity change occurs for every voxel can be used in combination which the sequential and recursive algorithm discussed in step c.

In accordance with a further embodiment of the invention, after each individual step of calculating the first or second magnitude said actually calculated first or second magnitude is added up to a so far calculated sum of all first and second magnitudes, resulting in a new so far (i.e. up to now) calculated sum of all first or second magnitudes. I.e. after each update of $M_{kx}^1$ and $M_{kx}^2$ the computation of the sums $M^1$ and $M^2$ is performed. This limits the storage requirements of the proposed algorithm. Instead of keeping individual magnitudes after each magnitude calculation step in a memory, a newly calculated magnitude is simply added to a previously determined magnitude, mathematically expressed by $M_{new} = M_{new} + M_{actually\ calculated}$.

In accordance with a further embodiment of the invention, the method further comprises repeating steps a to g for all remaining k-space directions. For example these k-space directions comprise one of a readout gradient direction, phase encoding direction or slice encoding direction. Consequently, by repeating all steps, a total gradient map can be provided.

In accordance with a further embodiment of the invention, the 3D and the 1D discrete Fourier transforms are fast Fourier transforms (FFT). Consequently, the algorithm is further speeded up.

In accordance with a further embodiment of the invention, in case the step c (i.e. the recursive algorithm step) is performed for the first time, the method comprises generating an initial image dataset by a 3D Fourier transformation of the acquired k-space dataset, wherein in this case in step c the previous image dataset generation step is given by the generation of said initial image dataset. In other words, initially a 3D Fourier transform of the acquired k-space dataset is performed resulting in an initial image dataset, which is used as a starting point for the recursive generation of updated image datasets in step c. In the very first ('updated') image generation, consequently the determined Fourier term is subtracted from the initial image dataset which results in an updated image dataset which can be used for further recursive steps.

In accordance with a further embodiment of the invention, the acquired dataset comprises magnetic resonance echo data of multiple echoes with different echo times, wherein a susceptibility gradient map is determined separately for each echo time resulting in a temporary susceptibility gradient map, wherein the method further comprises calculating a total susceptibility gradient map by combining all determined temporary susceptibility gradient maps. For example, the multiple echoes are a dual echo. This permits to further improve the quality of resulting susceptibility gradient maps without any appreciable delay in acquisition and data processing time.

In order to understand this more deeply, making reference to equation (2), application of this equation yields a measurement of the susceptibility gradient that does not depend on the particular choice of the echo time TE. However, the choice of TE has an influence on the SNR (signal to noise ratio) of the computed susceptibility gradient map. Assuming that the gradient-echo image used to compute $G_{su}$ is characterized by an SNR equal to $S/\sigma$ (S and $\sigma$ are the local signal amplitude and noise standard deviation respectively), it can be shown that the noise standard deviation in the computation of the echo shift m is proportional to $\sigma/S$. From Eq. (2), one can finally conclude that the noise standard deviation of the susceptibility gradient map is proportional to $\sigma/(S \cdot TE)$, for given acquisition parameters G and $\tau$.

Hence, increasing the echo time has a direct impact on the SNR of SGM: A doubling of the echo time doubles the SNR of the susceptibility gradient map. However, the signal amplitude S is also influenced by TE, through the transverse relaxation time T2*. While the noise reduction obtained through increasing TE normally surpasses the signal loss due to exponential T2* decay, very rapidly decaying signal can be observed if the B0 inhomogeneity gradient is very large. In this situation, there may be locally no more signal available at the applied TE to compute the susceptibility gradient.

In order to benefit from the high SNR provided by long echo times, while avoiding complete signal loss due to very large B0 inhomogeneity, in accordance with an embodiment the dual-echo approach (or in general the multi-echo approach) is used. A gradient-echo image at short echo time $TE_0$ is acquired additionally to the gradient-echo image acquired at the 'usual' echo time $TE_1$. Generally, because $TE_1$ is long enough, this can be done in a dual-echo scan without any scan time penalty. One example illustrating the choice of $TE_0$ and $TE_1$ is, that $TE_1$ is at least a factor of 3 larger than $TE_0$.

From the two gradient echo images $S_0$ and $S_1$, two susceptibility gradient maps $G_{su,0}$ and $G_{su,1}$ can be computed by application of the SGM technique discussed above. However, in general any SGM technique could be used in combination with this multi-echo (e.g. dual-echo) method. By combining the two maps $G_{su,0}$ and $G_{su,1}$, an optimal susceptibility gradient map $G_{su}$ is obtained.

While there are many different ways to combine these two maps, in accordance with an embodiment of the invention a linear combination may be used, with weights $w_0$ and $w_1$ chosen so as to minimize the noise in the final maps. This yields following equation:

$$G_{su}(x, y, z) = w_0(x, y, z) \cdot G_{su,0}(x, y, z) + w_1(x, y, z) \cdot G_{su,1}(x, y, z) \quad (5)$$

$$w_0(x, y, z) = \frac{(TE_0 \cdot S_0(x, y, z))^2}{(TE_0 \cdot S_0(x, y, z))^2 + (TE_1 \cdot S_1(x, y, z))^2}$$

$$w_1(x, y, z) = \frac{(TE_1 \cdot S_1(x, y, z))^2}{(TE_0 \cdot S_0(x, y, z))^2 + (TE_1 \cdot S_1(x, y, z))^2}$$

The weights $w_0$ and $w_1$ depend on the local signal amplitudes $S_0(x,y,z)$ and $S_0(x,y,z)$. In Eq. (5), it has been assumed that the noise standard deviations of $S_0$ and $S_1$ are identical, which is the case if the two images are acquired with the same sequence parameters except for the echo time, as in the dual echo approach. Otherwise, the definition of $w_0$ and $w_1$ should be modified accordingly.

With the equation (5) for the weights $w_0$ and $w_1$, an optimal automatic balance is achieved for each pixel between signal strength and echo time. The resulting susceptibility gradient map $G_{su}$ has an improved SNR as compared to each of the two maps $G_{su,0}$ and $G_{su,1}$, and is less affected by signal voids than $G_{su,1}$. The extent to which artifacts due to very rapidly decaying signal can be completely avoided depends on the minimal achievable echo time $TE_0$ (usually in the order of 2-3 ms), the spatial resolution of the gradient echo images, and the strength of the B0 inhomogeneity.

In order to overcome these limitations, in accordance with an embodiment of the invention, acquisition of the first echo can be done with an ultra-short echo time sequence, like UTE (described for example in Rahmer J, Boernert P, Groen J, Bos C. 3D Radial ultrashort echo-time imaging with T2 adapted sampling. Magn Reson Med 2006; 55:1075-1082).

Extension of the proposed method to the acquisition of multiple echo images is possible. A multiple-echo gradient echo sequence, as used for T2* mapping, can be applied for this purpose. Alternatively, images can be acquired separately at increased echo times, which allows for more flexibility in the choice of the echo times. Susceptibility gradient maps $G_{su,i}$ are then computed for each echo time $TE_i$. Combination of the individual maps $G_{su,i}$ to yield an optimal map $G_{su}$ is done by generalization of Eq. (5), according to:

$$G_{su}(x, y, z) = \sum_i w_i(x, y, z) \cdot G_{su,i}(x, y, z) \quad (6)$$

$$w_i(x, y, z) = \frac{(TE_i \cdot S_i(x, y, z))^2}{\sum_i (TE_i \cdot S_i(x, y, z))^2}$$

The multi-echo approach has the advantage that the particular choice of the echo times has almost no effect on the produced SGM. Ideally, the user could only decide how much scan time to spend, and number and spacing of the echo times are chosen automatically by the system. This setting guarantees maximal intra- and inter-user reproducibility of the SGM results.

In another aspect, the invention relates to a method of determining a susceptibility gradient map, the method comprising acquiring a magnetic resonance k-space dataset, said dataset comprising magnetic resonance echo data, wherein the acquired dataset comprises magnetic resonance echo data of multiple echoes with different echo times, wherein a susceptibility gradient map is determined separately for each echo time resulting in a temporary susceptibility gradient map, wherein the method further comprises calculating a total susceptibility gradient map by combining all determined temporary susceptibility gradient maps, i.e. this method can be used with any kind of SGM technique.

In another aspect, the invention relates to a computer program product comprising computer executable instructions to perform the methods as described above.

In another aspect, the invention relates to a device for determining a susceptibility gradient map of an object by magnetic resonance imaging, wherein the device comprises a data acquisition system for acquiring a magnetic resonance k-space dataset, said dataset comprising magnetic resonance data, wherein the device is arranged for transforming the acquired k-space dataset into an image dataset I(x,y,z), wherein for a given k-space direction, for example x, the device is further arranged for:

a) performing a 1D discrete Fourier transform of the image dataset along the given k-space direction, said 1D Fourier transform resulting in a set of Fourier terms, each Fourier term of said set being associated to a k-space index along the given k-space direction,
b) selecting a truncation value (kx) steadily varying between −N/2 and N/2 along said k-space direction, where N is the size of the k-space dataset in that direction.
c) generating recursively (formulas 3 and 4) an image dataset $I_{kx}^1(x,y,z)$ by determining the Fourier term of the set of Fourier terms which associated k-space index corresponds to said truncation value and subtracting the determined Fourier term from an image dataset $I_{kx-1}^1(x,y,z)$ generated in an immediate previous image dataset generation step, said subtraction resulting in a new updated image dataset $I_{kx}^1(x,y,z)$,
d) calculating a magnitude $M_{kx}$ of the new updated image dataset,
e) repeating steps b) to d) with increasing or decreasing truncation value (kx),
f) calculating for the given k-space direction an echo shift (m) from the magnitude variations between the new updated image datasets,
g) calculating a susceptibility gradient ($G_{su}$) along the given k-space direction from said echo shift.

Preferably, the above mentioned steps are carried out for all k-space directions, wherein thereafter the different susceptibility gradient maps may be combined into one magnitude gradient map.

In another aspect, the invention relates to a device for determining a susceptibility gradient map of an object by magnetic resonance imaging, wherein the device comprises a data acquisition system for acquiring a magnetic resonance k-space dataset comprising magnetic resonance echo data of multiple echoes with different echo times, wherein the device is arranged for a) determining a susceptibility gradient map separately for each echo time resulting in a temporary susceptibility gradient map,
b) calculating a total susceptibility gradient map by combining the all determined temporary susceptibility gradient maps.

BRIEF DESCRIPTION OF THE DRAWINGS

The enclosed drawings disclose preferred embodiments of the present invention. It should be understood, however, that the drawings are designed for the purpose of illustration only and not as a definition of the limits of the invention. In the drawings.

DETAILED DESCRIPTION OF EMBODIMENTS

Figure 1:
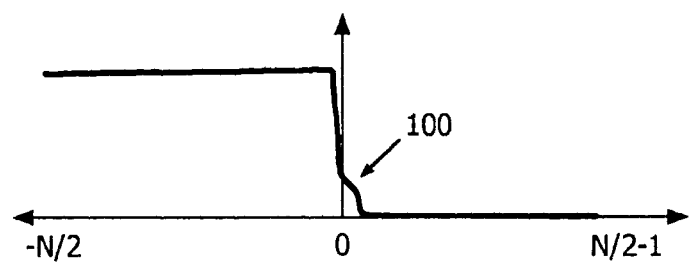
FIG. 1 illustrates the evolution of the truncated signal amplitude as a function of a degree of truncation in the absence of a b0 inhomogeneity gradient.
Figure 2:
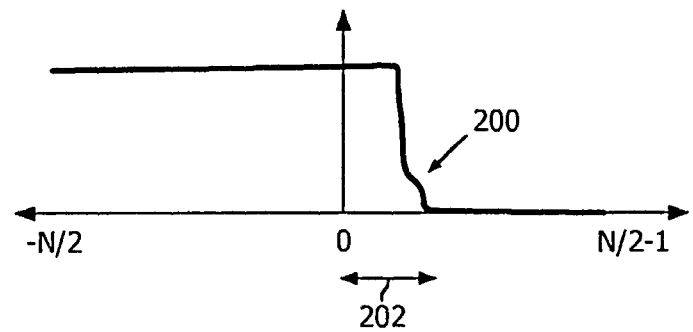
FIG. 2 illustrates an evolution of the truncated signal amplitude as a function of a degree of truncation in the presence of b0 inhomogeneity gradient.

FIGS. 1 and 2 illustrate the evolution of the truncated signal amplitude $M_{kx}^2$ as a function of the degree of truncation kx in the absence (FIG. 1) and in the presence (FIG. 2) of B0 inhomogeneity gradient. In FIG. 1, the signal drop off 100 is observed for kx=0, whereas in FIG. 2 the signal drop off 200 is observed for a value kx not=0. This results in an echo shift 202 which allows the computation of the susceptibility gradient $G_{su,x}$ by means of equation 2, as discussed above in detail. In general, subtracting the area under both intensity curves shown in FIGS. 1 and 2 and normalizing to the voxel intensity leads to the shift of the echo for each voxel. Performing this procedure in all spatial dimensions and preferably for all voxels allows for the generation of a susceptibility gradient map.

Figure 3:
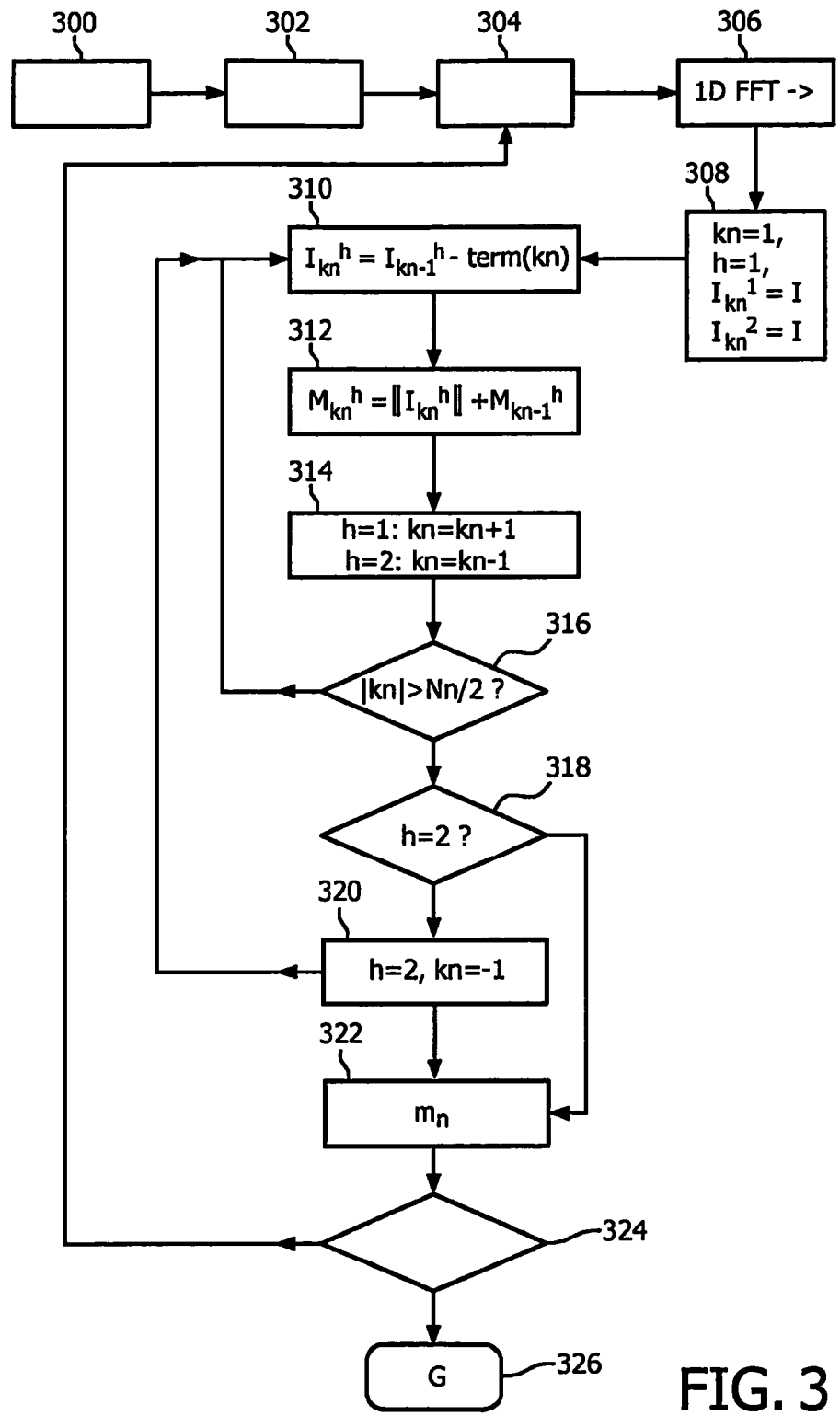
FIG. 3 is a flowchart illustrating various steps of the method according to the invention.

FIG. 3 is a flowchart illustrating the individual method steps for determining a susceptibility gradient map. The method starts in step 300 with the acquisition of a magnetic resonance k-space dataset, wherein this dataset comprises magnetic resonance echo data. In step 302, the dataset is transformed into a 3D image (I), which is followed by step 304 in which a desired k-space direction is set.

Thereafter, in step 306 a 1D discreet Fourier transform, for example by means of a fast Fourier transformation, is performed on the image dataset along the k-space direction set in step 304. This results in a set of Fourier terms, wherein each Fourier term of said set is associated to a respective k-space index along the given k-space direction. In formula 3 and 4, these terms correspond to the Fourier coefficients S(k,y,z) multiplied with the respective exponent.

The method continues in step 308, in which kn and h are set to 1. Here, n indicates the spatial direction set in step 304, i.e. n is for example the x, y or z direction in the present embodiment. It has to be noted, that as spatial direction any suitable direction may be used, even independent on any spatial directions in which an MR scan is performed. kn indicates the truncation value.

Since in the embodiment discussed with respect to FIG. 3 both halves of k-space are separately analyzed, a respective indicator h has a value in between 1 and 2. Consequently, in case of h=1, the values of kn are (for n=x) in between −Nx/2 . . . 0 and for h=2 the values for kx are in between +Nx/2 . . . 0 with Nx being the dimension of the sampling matrix in the x-direction (or in general in the desired k-space direction n).

Further, in step 308 $I_{kn}^1$ and $I_{kn}^2$ are set equal to I. In formulas 3 and 4 this corresponds to the first step which is performed in these formulas.

After performing step 308, the method continues with step 310 which is the recursion in which the 3D Fourier transform of the truncated signal is calculated. In detail, in step 310 the term corresponding to kn=1 is subtracted from a previously calculated 3D Fourier transform of the truncated signal corresponding to kn=0. This 3D Fourier transform of the truncated signal with kn=0 was defined in step 308 as the 3D Fourier transform I, i.e. the 3D complex image. This finally results in a new updated 3D Fourier transform. It has to be mentioned that there may be an additional inner loop within step 310, which consists in iterating over all voxels (x, y, z). As discussed above, the subtraction between $I_{kn}^1$ and the Fourier term may be done voxel-wise.

In step 312, the magnitude of said 3D Fourier transform calculated in step 310 is determined and added to the magnitude calculated in a previous step. Since a previous step is not existing at this time, the 'previous magnitude' is assumed to 0. Consequently, the magnitude $M_{kn}^h$ (h=1 or h=2, kn=0) corresponds to the magnitude of $I_{kn}^h$ (h=1 or h=2, and kn=0).

In step 314, kn is incremented by 1 and in step 316 it is checked if the absolute value of kn is larger than Nx/2 (in general Nn/2). Assuming this is not the case the method comes back to step 310 in which for the new kn an updated image dataset is determined. Now, the image dataset which was acquired in the previous step is used and the term corresponding to the new kn is subtracted from this image dataset. This results in a new updated image dataset which in step 312 is used for an updated magnitude calculation. This calculation in step 312 comprises the addition of the magnitude of the updated image dataset determined in step 310 to the magnitude which was calculated in step 312 in the previous loop.

In step 314, kn is again incremented, whereas in step 316 it is checked again if the absolute value of kn is larger than Nx/2 (in general Nn/2).

In case the absolute value of kn is larger than Nn/2, this indicates that for the first half of k-space all k-space values were analyzed. Thus, the same analysis for magnitude calculation has to be performed for the second half, such that in step 318 it is first checked if this has already been done. Since this is not the case at the moment, the method continues with step 320 in which h is set to 2 and kn is set to −1. Subsequently, the iteration continues looping again between the steps 310 and 316 as already described above.

It has to be noted that in an alternative embodiment the steps "h=1" and "h=2" may be done simultaneously in the most inner loop of the algorithm.

Finally, when all truncation values in k-space in the desired k-space direction were analyzed successfully, the method is directed to step 322, in which the echo shift $m_n$ for the desired k-space direction n is calculated. This calculation was already discussed above in detail. Basically, the difference between the sum of all magnitudes of all updated image datasets of the second half of k-space and the sum of all magnitudes of all updated image datasets of the first half of k-space is calculated and normalized by the magnitude of the 3D Fourier transform of the dataset acquired in step 300. This allows the computation of the echo shift and further the computation of the desired susceptibility gradient by means of equation 1.

The method continues in step 324 in which it is checked if a next direction in k-space is available for analysis. If this is the case, the method jumps back to step 304 in which a further k-space direction is set and continues looping with the steps 306-324. In case no k-space direction is left for analysis, the method ends in step 326 with the final computation of the susceptibility gradient map.

Figure 4:
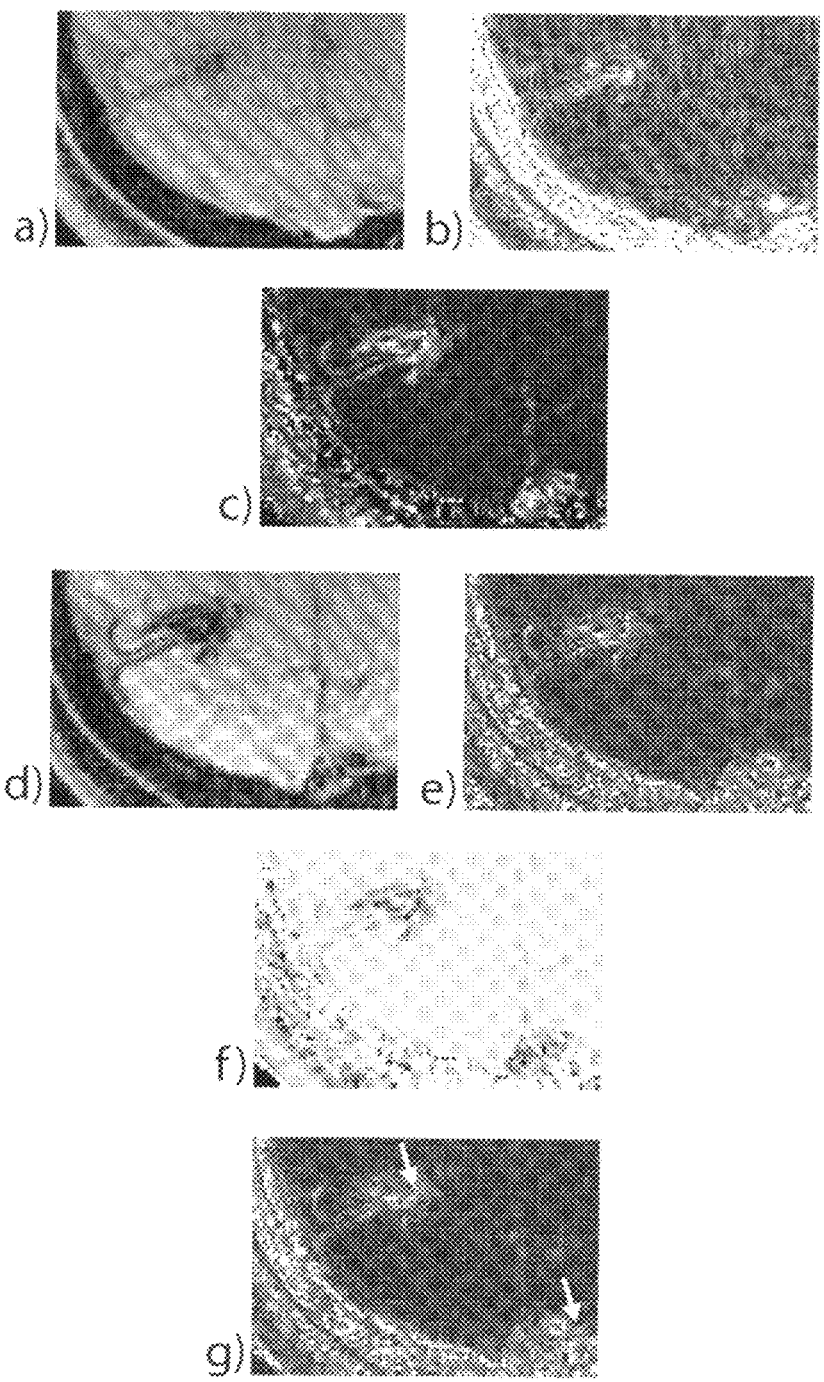
FIG. 4 illustrates various images acquired for dual echo susceptibility gradient mapping at 3T.

FIG. 4 illustrates a dual echo susceptibility gradient mapping at 3T. In step a, a first gradient echo image $S_0$ is acquired at a short echo time $TE_0$. The image shown in FIG. 4b shows the corresponding susceptibility gradient map $G_{su,0}$ and a corresponding weighting map $w_0$ is shown in FIG. 4c which was calculated according to equation 5 as discussed above.

A second gradient echo image $S_1$ acquired at a longer echo time $TE_1$, a corresponding susceptibility gradient map $G_{su,1}$ and a corresponding weight map w1 are shown in FIGS. 4d, e and f. Echo time $TE_1$ of the second gradient echo image $S_1$ is about a factor of 3 larger compared to the echo time $TE_0$ used for acquisition of the first gradient echo image $S_0$ of FIG. 4a.

The final image 4g shows the combined susceptibility gradient map $G_{su}$, obtained as a linear combination of $G_{su,0}$ and $G_{su,1}$, with the weights $w_0$ and $w_1$. The weight maps are scaled between 0 (black) and 1 (white). Notable improvements are achieved in the depiction of the large susceptibility gradients (arrows). They correspond to locations where the signal in the second gradient echo image is almost vanished, but is still present in the first echo.

Figure 5:
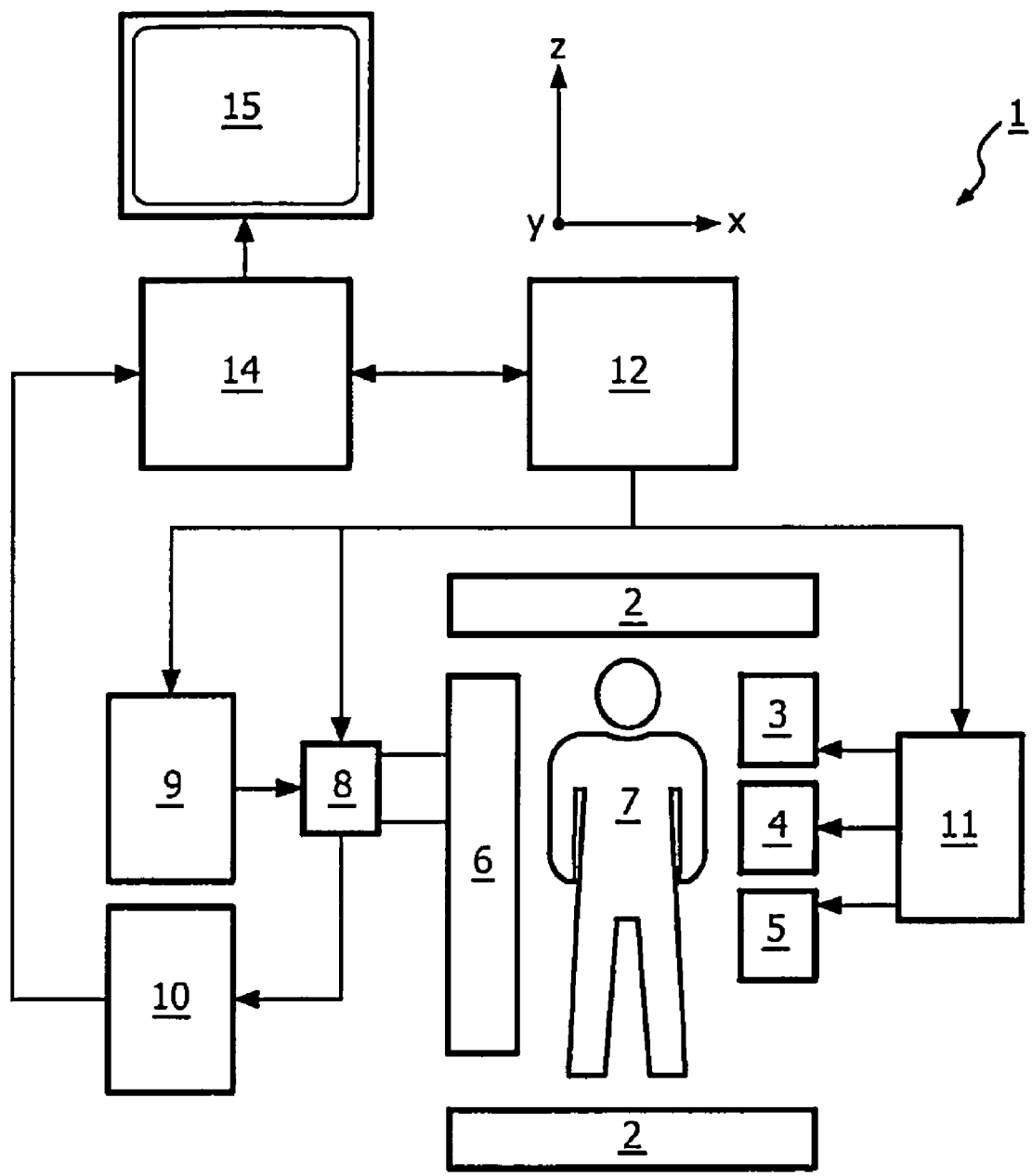
FIG. 5 shows an MR scanner according to the invention.

In FIG. 5 an MR imaging device 1 in accordance with the present invention is shown as a block diagram. The apparatus 1 comprises a set of main magnetic coils 2 for generating a stationary and substantially homogeneous main magnetic field and three sets of gradient coils 3, 4 and 5 for superimposing additional magnetic fields with controllable strength and having a gradient in a selected direction. Conventionally, the direction of the main magnetic field is labelled z-direction, the two directions perpendicular are labelled the x and y-directions. The gradient coils 3, 4 and 5 are energized by a power supply 11.

The imaging device 1 further comprises an RF transmit antenna 6 for emitting radio frequency (RF) pulses to a body 7. The antenna 6 is coupled to a modulator 9 for generating and modulating the RF pulses. Also provided is an RF receiver for receiving the MR signals, the receiver can be identical to the transmit antenna 6 or be separate. If the transmit antenna 6 and receiver are physically the same antenna as shown in FIG. 1, a send-receive switch 8 is arranged to separate the received signals from the pulses to be emitted. The received MR signals are input to a demodulator 10. The send-receive switch 8, the modulator 9, and the power supply 11 for the gradient coils 3, 4 and 5 are controlled by a control system 12. Control system 12 controls the phases and amplitudes of the RF signals fed to the antenna 6.

The control system 12 is usually a microcomputer with a memory and a program control. The demodulator 10 is coupled to a reconstruction means 14, e.g. a computer for transformation of the received signals into images that can be made visible, e.g. on a visual display unit 15.

Further, the MR imaging device 1 comprises a set of three shim coils (not shown). An auxiliary magnetic field is generated by shim currents passed through the shim coils via separate shim channels from a shim current supply. The strength of the shim current is controlled by control system 12 to optimize the homogeneity of the main magnetic field.

For practical implementation of the invention, the MR device 1 comprises the programming for carrying out the above described method. The program may be carried out for example by the reconstruction means 14 or a further computer or hardware component attached to the device 1.

The invention claimed is:

1. A method of determining a susceptibility gradient map, the method comprising acquiring a magnetic resonance k-space dataset, said dataset comprising magnetic resonance echo data, and transforming the acquired k-space dataset into an image dataset wherein for a given k-space direction, the method comprises
   a) performing a 1D discrete Fourier transform of the image dataset along the given k-space direction, said 1D Fourier transform resulting in a set of Fourier terms, each Fourier term of said set being associated to a k-space index along the given k-space direction,
   b) selecting a truncation value steadily varying between −N/2 and N/2 along said k-space direction, where N is the size of the k-space dataset in said k-space direction, c) generating recursively an updated image dataset by determining the Fourier term of the set of Fourier terms which associated k-space index number corresponds to said truncation value and subtracting the determined Fourier term from an image dataset generated in an immediate previous image dataset generation step, said subtraction resulting in a new updated image dataset, d) calculating a magnitude of the new updated image dataset, e) repeating steps b) to d) with increasing or decreasing truncation value, f) calculating for the given k-space direction an echo shift from the magnitude variations between the new updated image datasets, g) calculating a susceptibility gradient along the given k-space direction from said echo shift.

2. The method of claim 1, wherein in a first loop in step b) the truncation value is steadily increasing from zero to half of the total number of k-space indices of the k-space dataset along said k-space direction, resulting in step c) in first new updated image datasets and in step d) in first magnitudes, in a second loop in step b) the truncation value is steadily decreasing from zero to minus half of the total number of k-space indices of the k-space dataset along said k-space direction, resulting in step c) in second new updated image datasets and in step d) in second magnitudes, in step f) the echo shift is calculated from the difference between the sum of all second magnitudes of all second new updated image datasets and the sum of all first magnitudes of all first new updated image datasets.

3. The method of claim 2, wherein after each individual step of calculating the first or second magnitude said actually calculated first or second magnitude is added up to a so far calculated sum of all first or second magnitudes, resulting in a new so far calculated sum of all first or second magnitudes.

4. The method of claim 1, further comprising repeating steps a) to g) for all remaining k-space directions.

5. The method of claim 1, wherein the k-space direction is one of a readout gradient direction, phase encoding direction or a slice-encoding direction.

6. The method of claim 1, wherein the 3D and the 1D discrete Fourier transforms are fast Fourier transforms.

7. The method of claim 1, wherein in case step c) is performed for the first time, the method comprises generating an initial image dataset by a 3D Fourier transform of the acquired k-space dataset, wherein in this case in step c) the previous image dataset generation step is given by the generation of said initial image dataset.

8. The method of claim 1, wherein the acquired dataset comprises magnetic resonance echo data of multiple echoes with different echo times, wherein a susceptibility gradient map is determined separately for each echo time resulting in a temporary susceptibility gradient map, wherein the method further comprises calculating a total susceptibility gradient map by combining all determined temporary susceptibility gradient maps.

9. The method of claim 8, wherein the multiple echo is a dual-echo.

10. The method of claim 8, wherein the acquisition of the magnetic resonance k-space dataset for one of the multiple echoes is performed with an ultra-short echo time sequence.

11. A method of determining a susceptibility gradient map, the method comprising acquiring a magnetic resonance k-space dataset, said dataset comprising magnetic resonance echo data, wherein the acquired dataset comprises magnetic resonance echo data of multiple echoes with different echo times, wherein a susceptibility gradient map is determined separately for each echo time resulting in a temporary susceptibility gradient map, wherein the method further comprises calculating a total susceptibility gradient map by combining all determined temporary susceptibility gradient maps.

12. A computer program product comprising a non-transitory computer readable medium including computer executable instructions, which when executed by a processor is configured to perform the method as claimed in claim 1.

13. A device for determining a susceptibility gradient map of an object by magnetic resonance imaging, wherein the device comprises a data acquisition system for acquiring a magnetic resonance k-space dataset, said dataset comprising magnetic resonance echo data, wherein the device is arranged for transforming the acquired k-space dataset into an image dataset, wherein the device is further arranged for a) performing a 1D discrete Fourier transform of the image dataset along a given k-space direction, said 1D Fourier transform resulting in a set of Fourier terms, each Fourier term of said set being associated to a k-space index along the given k-space direction, b) selecting a truncation value steadily between $-N/2$ and $N/2$ along said k-space direction, where N is the size of the k-space dataset in that direction, c) generating recursively an updated image dataset by determining the Fourier term of the set of Fourier terms which associated k-space index number corresponds to said truncation value and subtracting the determined Fourier term from an image dataset generated in an immediate previous image dataset generation step, said subtraction resulting in a new updated image dataset, d) calculating a magnitude of the new updated image dataset, e) repeating steps b) to d) with increasing or decreasing truncation value, f) calculating for the given k-space direction an echo shift from the magnitude variations between the new updated image datasets, g) calculating a susceptibility gradient along the given k-space direction from said echo shift.

14. A device for determining a susceptibility gradient map of an object by magnetic resonance imaging, wherein the device comprises a data acquisition system for acquiring a magnetic resonance k-space dataset comprising magnetic resonance echo data of multiple echoes with different echo times, wherein the device is arranged for determining a susceptibility gradient map separately for each echo time resulting in a temporary susceptibility gradient map, calculating a total susceptibility gradient map by combining the all determined temporary susceptibility gradient maps.

* * * * *